US008816351B2

(12) United States Patent
Lim et al.

(10) Patent No.: US 8,816,351 B2
(45) Date of Patent: Aug. 26, 2014

(54) SEMICONDUCTOR DEVICE HAVING A LASER ANNEALED SEMICONDUCTOR LAYER

(75) Inventors: Kian Kiat Lim, Singapore (SG); Atsushi Nakamura, Kazo (JP); Kai Pheng Tan, Singapore (SG); Eng Soon Lim, Singapore (SG); Poh Ling Fu, Singapore (SG); Takaaki Kamimura, Fukaya (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 13/301,374

(22) Filed: Nov. 21, 2011

(65) Prior Publication Data

US 2012/0061678 A1    Mar. 15, 2012

Related U.S. Application Data

(62) Division of application No. 12/419,588, filed on Apr. 7, 2009, now Pat. No. 8,076,186.

(30) Foreign Application Priority Data

Apr. 9, 2008 (SG) ................................ 200802817-7

(51) Int. Cl.
    *H01L 27/14*    (2006.01)
(52) U.S. Cl.
    USPC .. 257/72; 257/75; 257/E33.053; 257/E31.043
(58) Field of Classification Search
    CPC ............ H01L 21/02675; H01L 28/268; H01L 27/1214; H01L 21/32155; H01L 29/167
    USPC ..................... 257/72, 75, E33.053, E31.043
    See application file for complete search history.

(56) References Cited

U.S. PATENT DOCUMENTS

| 4,772,927 A | * | 9/1988 | Saito et al. ...................... 257/66 |
| 6,136,632 A | * | 10/2000 | Higashi ......................... 438/166 |
| 2004/0235276 A1 | * | 11/2004 | Lin ................................ 438/487 |
| 2006/0223333 A1 | * | 10/2006 | Li et al. ......................... 438/762 |
| 2007/0141859 A1 | | 6/2007 | Ishihara et al. |
| 2007/0155070 A1 | | 7/2007 | Ouchi et al. |
| 2007/0232033 A1 | | 10/2007 | Wieczorek et al. |

FOREIGN PATENT DOCUMENTS

| JP | 62-147759 | 7/1987 |
| JP | 4-186737 | 7/1992 |
| JP | 7-249591 | 9/1995 |
| JP | 2003-17505 | 1/2003 |

(Continued)

OTHER PUBLICATIONS

Office Action issued Feb. 11, 2011 in the corresponding Korean Application No. 10-2009-30491 (with English Translation).

(Continued)

*Primary Examiner* — Tucker Wright
(74) *Attorney, Agent, or Firm* — Oblon, Spivak, McClelland, Maier & Neustadt, L.L.P.

(57) ABSTRACT

A laser annealing method includes forming a nitrogen-doped layer on a semiconductor layer, the nitrogen-doped layer having a nitrogen concentration of at least $3 \times 10^{20}$ atoms/cc, irradiating a first area of the nitrogen-doped layer in a low oxygen environment with a laser beam and irradiating a second area of the nitrogen-doped layer in a low oxygen environment with a laser beam, a part of the second area overlapping with the first area.

13 Claims, 5 Drawing Sheets

(56) References Cited

FOREIGN PATENT DOCUMENTS

| | | |
|---|---|---|
| JP | 2005-166768 | 6/2005 |
| JP | 2007-35812 | 2/2007 |
| JP | 2007-288173 | 11/2007 |
| KR | 10-0287776 | 12/2001 |
| WO | WO 2004/032196 | 4/2004 |

OTHER PUBLICATIONS

Office Action issued Feb. 26, 2013 in Japanese Application No. 2009-074902 (With English Translation).
U.S. Appl. No. 13/747,789, filed Jan, 23, 2013, Nakamura et al.
U.S. Appl. No. 13/747,831, filed Jan. 23, 2013, Nakamura.

* cited by examiner (Compareter example)

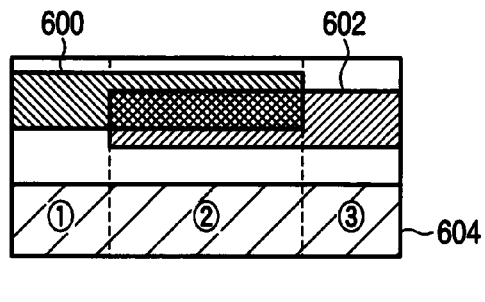
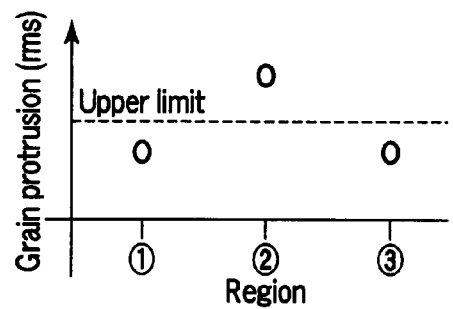
F I G. 5A          F I G. 5B
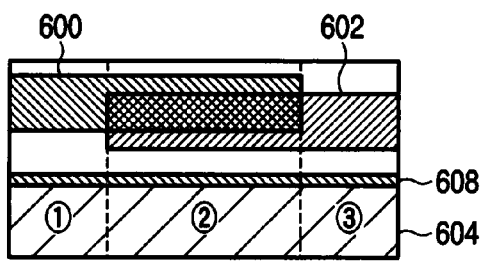
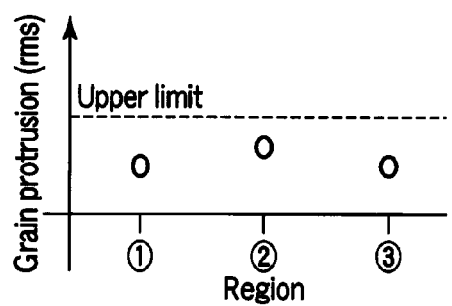
F I G. 6A          F I G. 6B
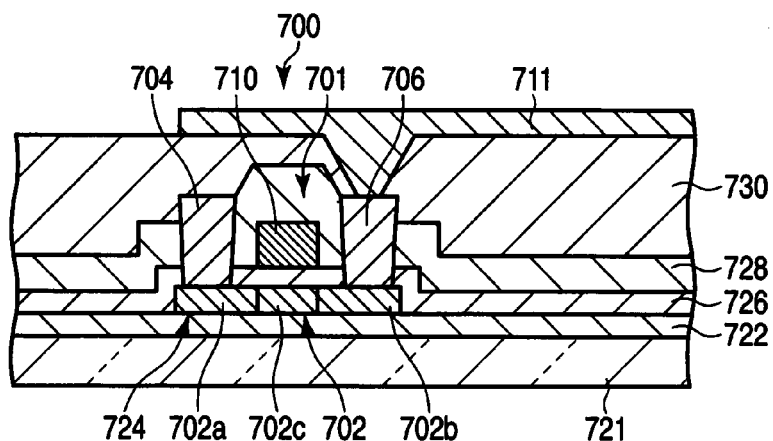
F I G. 7

SEMICONDUCTOR DEVICE HAVING A LASER ANNEALED SEMICONDUCTOR LAYER

CROSS-REFERENCE TO RELATED APPLICATIONS

This application is a division of and claims the benefit of priority under 35 U.S.C. §120 from U.S. Ser. No. 12/419,588 filed Apr. 7, 2009, and claims the benefit of priority under 35 U.S.C. §119 from Singaporean Patent Application No. 200802817-7 filed Apr. 9, 2008, the entire contents of each of which are incorporated herein by reference.

BACKGROUND OF THE INVENTION

1. Field of the Invention

The present invention relates to a method of laser annealing a semiconductor layer and semiconductor devices produced thereby.

2. Description of the Related Art

The production of semiconductor devices commonly includes one or more steps of laser annealing a semiconductor layer. Typically, but not exclusively, laser annealing is carried out to crystallize a non-single-crystal semiconductor layer, such as an amorphous semiconductor layer of the semiconductor device before it is further processed.

For example, in the production of flat panel display devices such as liquid crystal displays (LCDs) and organic light emitting diode (OLED) displays, an amorphous silicon (a-Si) layer may be laser-annealed to form a polycrystalline silicon (p-Si) layer, by using which thin-film transistors (TFTs) that control the pixels of the LCD or OLED display may be formed.

Depending on the size of the layer to be annealed and the dimensions of the irradiating laser beam, laser annealing may be carried out in two or more sweeps or scans. For example, in the case where laser annealing is carried out on an a-Si semiconductor layer including a 2×2 array of product regions, the laser beam 104 that is used for annealing has an effective working area having a predetermined length x and width y. Typically, the maximum length x of the laser beam is insufficient to irradiate the entire surface of the array. In most cases, therefore, the laser beam is first scanned across a first area of the array, and then the laser beam is scanned across a second area of the array in the same direction. For instance, as disclosed in Jpn. Pat. Appln. KOKAI Publication No. 7-249591, in order to ensure that the entirety of the array is annealed, the scanning of the laser beam in the second area is overlapped with the first area, creating an overlap region.

Due to the dual exposure to laser annealing, the overlap region generally exhibits undesirable characteristics, such as unacceptable variations in electrical or physical characteristics. To ensure that these undesirable characteristics do not affect the products manufactured from the array, the overlap region is conventionally arranged outside of the product regions.

As described above, since the conventional overlap region of the semiconductor layer is not usable for the fabrication of the product, due to the problems in electrical or physical characteristics of the overlap region, this part of the array becomes useless. Hence it is difficult to efficiently fabricate products from one array. In addition, if a product of a greater size is to be annealed, an overlap region of laser annealing occurs in the product, leading to the difficulty of fabrication.

BRIEF SUMMARY OF THE INVENTION

The present invention has been made in consideration of the above-described points, and its object is to provide a laser annealing method which enables annealing of a semiconductor layer without causing undesirable variations in electrical or physical properties of a semiconductor layer, can improve the efficiency of fabrication, and enables manufacture of large-sized products, and to provide a semiconductor device which is produced by this method.

According to an aspect of the invention, there is provided a method of laser annealing a non-single-crystalline semiconductor layer, the non-single-crystalline semiconductor layer including a product region, the method comprising:

forming a nitrogen-doped layer on the non-single-crystalline semiconductor layer, the nitrogen-doped layer having a nitrogen concentration of at least $3 \times 10^{20}$ atoms/cc;

irradiating a first area of the nitrogen-doped layer in a low oxygen environment with a laser beam; and irradiating a second area of the nitrogen-doped layer in a low oxygen environment with a laser beam, a part of the second area overlapping with the first area.

According to another aspect of the invention, there is provided a semiconductor device comprising a laser-annealed semiconductor layer, the laser-annealed semiconductor layer having a nitrogen concentration of at least $3 \times 10^{20}$ atoms/cc at a surface thereof.

According to the above method, the gap between product regions on the array no longer needs to function as an overlap region, and the distance therebetween can be decreased. Thereby, useless semiconductor surfaces or semiconductor substances can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5A is a cross-section diagram of the overlapping of two laser scans during the laser annealing by the method of the comparative example;

FIG. 5B is a graph showing the results of the laser annealing shown in FIG. 5A;

FIG. 6A is a cross-section diagram of the overlapping of two laser scans during laser annealing in accordance with one embodiment of the method;

FIG. 6B is a graph showing the results of the annealing of the embodiment shown in FIG. 6A;

FIG. 7 is a cross-section diagram showing a semiconductor device according to an embodiment of the invention;

DETAILED DESCRIPTION OF THE INVENTION

Figure 1:
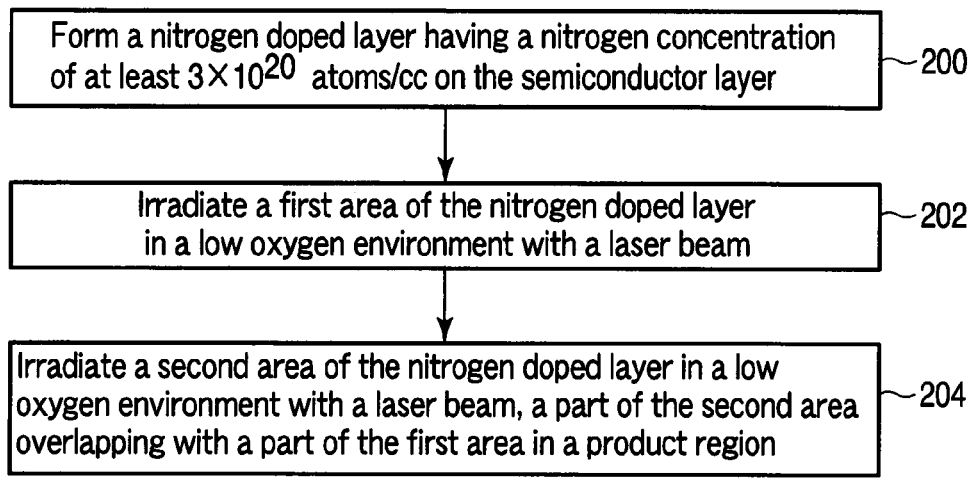
FIG. 1 is a flowchart illustrating the process flow of a method according to an embodiment of the present invention.

A laser annealing method and a semiconductor device according to an embodiment of the present invention will now be described in detail with reference to the accompanying drawings. FIG. 1 generally illustrates a method of laser annealing a semiconductor layer having one product region, according to an embodiment of the invention. The term "product region" as used in this specification denotes a region of a semiconductor layer on or in which a semiconductor device or components of a semiconductor device have been or will be formed. Non-limiting examples of semiconductor devices include transistors, diodes, and sensors.

At step 200 of FIG. 1, a nitrogen-doped layer having a nitrogen concentration of at least $3 \times 10^{20}$ atoms/cc is formed on the semiconductor layer. Laser irradiation in a low oxygen environment is then carried out at step 202 for a first area of the nitrogen-doped layer, and at step 204 for a second area of the nitrogen-doped layer. A part of the second area overlaps with a part of the first area in at least one product region. A "low oxygen environment" for the purposes of this specification is an environment in which the volume of oxygen is less than 2% of the total volume of the environment. In one form, the low oxygen environment has around 0.3% oxygen. In another form, the low oxygen environment has substantially 0% (i.e., 10 ppm or less) oxygen.

One embodiment of the method of FIG. 1 will now be described with reference to FIGS. 2A, 2B, and 2C, a cross-section of an example semiconductor layer 300 having a product region 302 is shown attached to a substrate 304. Skilled persons will appreciate that a plurality of product regions 302 may be provided instead of a single product region 302. The substrate 304 may be, for example, a glass, silicon, quartz or sapphire substrate, and the semiconductor layer 300 may be a non-single-crystal semiconductor layer, for example, an amorphous silicon (a-Si) layer, a microcrystalline silicon (μ-Si) layer, and polycrystalline silicon (p-Si) layer. The semiconductor layer 300 may be formed on the substrate 304 by sputtering, chemical vapor deposition (CVD, including specific types of CVD such as low-pressure CVD, plasma CVD, etc.) or like processes, as will be known to skilled persons.

It should be noted that the illustrated arrangement of semiconductor layer 300 in the Figure is not essential and that the cross-section view shown does not represent the entirety of the semiconductor layer and its arrangement over a substrate. For example, in central regions, there may be additional layers provided above or beneath the semiconductor layer 300. Non-limiting examples of such additional layers include one or more metal layers, one or more additional a-Si layers, or one or more silicon oxide (SiO) and/or silicon nitride (SiN) layers.

Figures 2A, 2B, 2C:
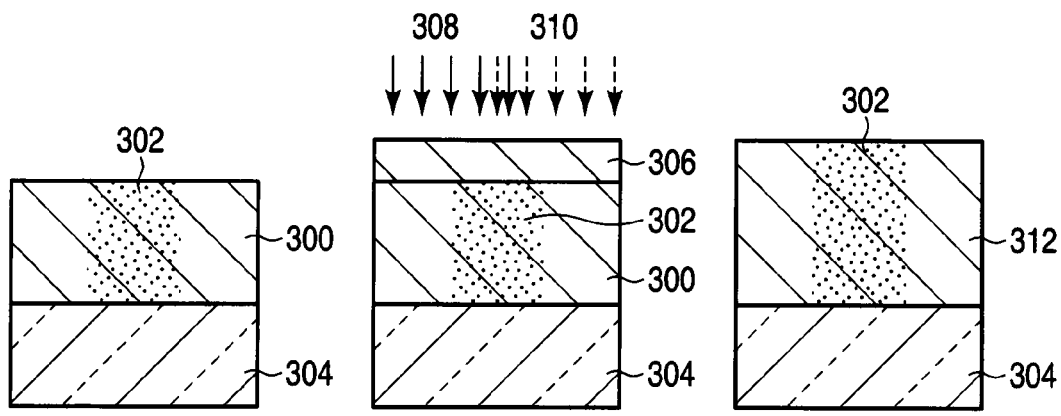
FIGS. 2A, 2B, and 2C are cross-section diagrams of a semiconductor layer being annealed in accordance with an embodiment of the method.

Referring now to FIG. 2B, a nitrogen-doped layer 306 is formed on the semiconductor layer 300 in accordance with step 200 of FIG. 1. The nitrogen-doped layer 306 has a nitrogen concentration of at least $3 \times 10^{20}$ atoms/cc. The applicant has found this to be a desirable concentration that reduces the occurrence of undesirable variations in characteristics, such as unacceptable ablation (i.e., loss of material from the surface) of the semiconductor layer when the laser annealing process is carried out in a low oxygen environment. The reason for laser annealing in a low oxygen environment will be explained later in this specification.

In this embodiment, the nitrogen concentration is between $3 \times 10^{20}$ and $3 \times 10^{22}$ atoms/cc. In another embodiment, the nitrogen concentration is between $5 \times 10^{20}$ and $5 \times 10^{21}$ atoms/cc.

The nitrogen-doped layer 306 may have a thickness in the range of 1 to 30 or 5 to 15 nm, for example. In one example, the nitrogen-doped layer 306 has a thickness of around 10 nm. The range of 1 to 30 nm has been found by the applicant to allow large and uniform grain size to be obtained after annealing, which improves the electron mobility of the annealed semiconductor layer, while ensuring ablation is reduced or avoided altogether. The specific range of 5 to 15 nm has been found by the applicant to allow the thickness of the nitrogen-doped layer 306 to be more easily controlled during mass production of semiconductor devices, thus allowing improved operating margins. With regard to grain size, where the above ranges of thickness of the nitrogen-doped layer 306 are implemented, the applicant has found it possible to obtain a desirably large and uniform grain size (i.e., greater than 0.2 μm) after annealing. In one example, the grain size after annealing is not less than 0.3 μm.

In the exemplary embodiment illustrated in FIG. 2B, the nitrogen-doped layer 306 is provided by forming a further a-Si layer on the a-Si semiconductor layer 300, and doping the further a-Si layer with nitrogen. In other words, the semiconductor layer 300 is a first a-Si layer and the nitrogen-doped layer 306 is a second a-Si layer that is doped with nitrogen. The second a-Si layer may be deposited by sputtering, chemical vapor deposition (CVD including specific types of CVD such as low-pressure CVD, plasma CVD, etc.) or like processes, and may be doped with nitrogen using a film forming process, an ion implantation process after the film forming, or a plasma doping process.

Where CVD is used, the second a-Si layer may be deposited in a CVD chamber and doped with a nitrogen substantially at the same time as the layer forming, by introducing silane ($SiH_4$) gas and a nitrogen-based gas (e.g., $N_2O$) in the CVD chamber. For instance, the silane gas may be introduced at a first flow rate and $N_2O$ gas may be introduced at a second flow rate. In this form, the nitrogen concentration and the thickness of the second a-Si layer may be controlled by controlling one or both of the first flow rate and the second flow rate. Also, in this form, the nitrogen-doped layer may be provided in a single step, thus reducing the time and cost associated with forming the nitrogen-doped layer. It is, however, not essential to both forming and dope the second a-Si layer substantially at the same time. For instance, the second a-Si layer may be formed first and then, nitrogen may be doped in the second a-Si layer by ion implanting or plasma doping nitrogen into the layer. In this form, the nitrogen concentration of the second a-Si layer may be controlled by controlling the energy used in the ion implantation or plasma doping process.

Once the nitrogen-doped layer 306 is formed, a first area of the nitrogen-doped layer 306 is irradiated with a laser beam in a low oxygen environment, in accordance with step 202 of FIG. 1, so as to anneal the first area and that portion of the a-Si semiconductor layer 300 which is substantially beneath the first area. The laser irradiation on the first area is represented in FIG. 2B as solid arrows 308.

A second area of the nitrogen-doped layer 306 is then irradiated with a laser beam in a low oxygen environment, in accordance with step 204 of FIG. 1, so as to anneal the second area and that portion of the a-Si semiconductor layer 300 which is substantially beneath the second area. The laser irradiation on the second area is represented in FIG. 2B as dashed arrows 310. In one form, each of the annealing steps is carried out in an environment having about 0.3% oxygen. In another form, each of the annealing steps is carried out in an environment having substantially 0% oxygen (oxygen concentration of 10 ppm or less).

A low oxygen environment is desirable during laser annealing as the concentration of oxygen in the annealing environment is directly proportional to the grain protrusion (i.e., a defect in the form of surface roughening) that is present on the semiconductor layer after annealing. This grain protrusion leads to deterioration in electrical and physical characteristics. In other words, a lower concentration of oxygen yields lower grain protrusion, which in turn yields desirable (or improved) electrical and physical characteristics.

However, laser annealing in a low oxygen environment typically increases the occurrence of other defects, such as ablation. By using a nitrogen-doped layer having a concentration of at least $3\times10^{20}$ atoms/cc on the semiconductor layer to be annealed, the applicant has found that laser annealing can be carried out in a low oxygen environment while suppressing the occurrence of an ablation. This will be described in further detail later in this specification.

Referring back to FIG. 2B, and as highlighted earlier, the laser annealing (by laser irradiation) of the first and second areas of the nitrogen-doped layer 306 is carried out such that a part of the first area and a part of the second area overlap in the product region 302. The benefits of having the overlap arranged in this manner will be apparent later in this specification.

Once the laser annealing steps have been carried out, the resulting arrangement is as shown in FIG. 2C, where the a-Si in the semiconductor layer 300 and the a-Si the nitrogen-doped layer 306 together form a polycrystalline silicon (p-Si) layer 312. Given the use of the nitrogen-doped layer 306, the layer 312 will include a surface having a nitrogen concentration of at least $3\times10^{20}$ atoms/cc. Once the layer 312 is formed, it can be sent for further processing (e.g., masking, etching, etc.). It will be apparent to skilled persons that the p-Si layer 312 formed in accordance with this embodiment has a thickness equal to that of the semiconductor layer 300 and the nitrogen-doped layer 306 combined. As a non-limiting example, if a 50-nm-thick p-Si layer is desired, the method may be carried out by forming and annealing a 10-nm-thick a-Si nitrogen-doped layer 306 on a 40-nm-thick a-Si semiconductor layer 300.

Another embodiment of the method of FIG. 1 will now be described with reference to FIGS. 3A to 3C.

Figures 3A, 3B, 3C:
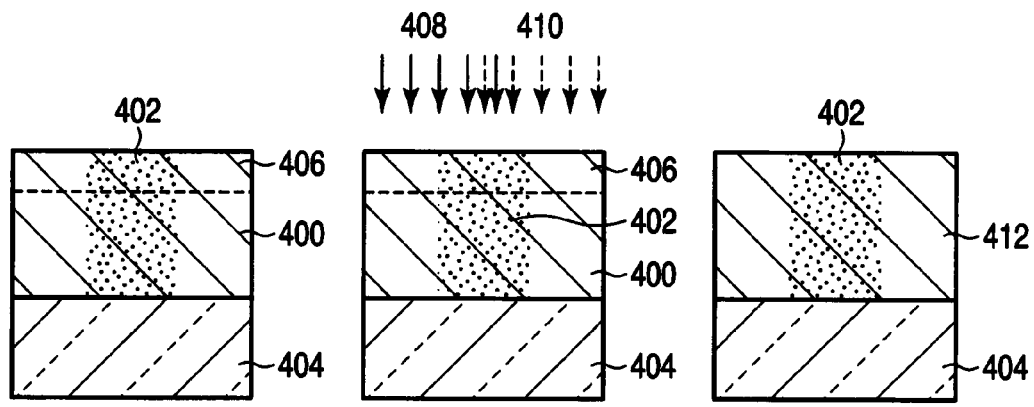
FIGS. 3A, 3B, and 3C are cross-section diagrams of a semiconductor layer being annealed in accordance with another embodiment of the method.

As with FIG. 2A, FIG. 3A shows a cross-section segment of an example semiconductor layer 400, which has a product region 402 and which is disposed on a substrate 404. In this form, step 200 of FIG. 1 is carried out by ion implanting or plasma doping nitrogen into the upper portion 406 of the semiconductor layer 400. This results in the upper portion 406 of the semiconductor layer 400 being converted into a nitrogen-doped layer 406. In other words, in this embodiment, the nitrogen-doped layer 406 forms part of the semiconductor layer 400 but it can be distinguished from the semiconductor layer 400 by virtue of the nitrogen concentration in the nitrogen-doped layer 406. The nitrogen concentration and depth (thickness) of the nitrogen-doped layer 406 may be controlled by controlling the energy used in the ion implantation or plasma doping process. As before, the nitrogen concentration is at least $3\times10^{20}$ atoms/cc.

Steps 202 and 204 of FIG. 1 are then carried out on the nitrogen-doped layer 406. Specifically, a first area of the nitrogen-doped layer 406 is subjected to laser annealing 408, and a second area of the nitrogen-doped layer 406 is subjected to laser annealing 410. As before, the first and second areas overlap in the product region 402, and the laser annealing process results in a crystallized layer 412. Where a-Si is used to form the semiconductor layer 400, the result of annealing is a p-Si layer 412. It will be apparent to skilled persons that the p-Si layer 412 in this embodiment will have a thickness substantially equal to that of the semiconductor layer 400. As a non-limiting example, if a 50-nm-thick p-Si layer is desired, the method in this embodiment may be carried out using a 50-nm-thick semiconductor layer 400.

In another example of the method of FIG. 1, step 200 further comprises forming a nitrogen-doped layer that includes oxygen, the oxygen concentration being in the range of $3\times10^{21}$ to $7\times10^{22}$ atoms/cc. More particularly, the oxygen concentration may be in the range of $5\times10^{21}$ to $5\times10^{22}$ atoms/cc. The oxygen concentration may be provided by forming the nitrogen-doped layer using nitrous oxide ($N_2O$) gas in a CVD process, or otherwise in the presence of oxygen (e.g., oxidation by air). Alternatively, the oxygen concentration may be provided by ion implanting or plasma doping oxygen into the nitrogen-doped layer.

It should be noted that the oxygen concentration may be obtained before, after, or at the same time as doping the layer with nitrogen.

As outlined earlier, the use of the nitrogen-doped layer in the present method allows a reduction in certain defects that are typically observed at the overlap region after the laser annealing process. In particular, the overlap region of a conventional laser annealing method typically exhibits excessive grain protrusion (i.e., surface roughness), which adversely affects the electrical and physical characteristics of that region of the annealed semiconductor layer. Specifically, where excessive grain protrusion is generated, it becomes difficult to cover the annealed semiconductor layer with a thin insulating layer to form a semiconductor device. This, in turn, may result in an electrical short between the annealed semiconductor layer and a conductive layer (e.g., a gate electrode) via the insulating layer, which is disposed between the annealed semiconductor layer and the conductive layer. This arrangement of layers of a semiconductor device will be described in further detail later with reference to FIG. 7. Given the above drawbacks, conventional laser annealing is restricted in that the overlap region must be provided outside of product regions.

Figures 4A, 4B:
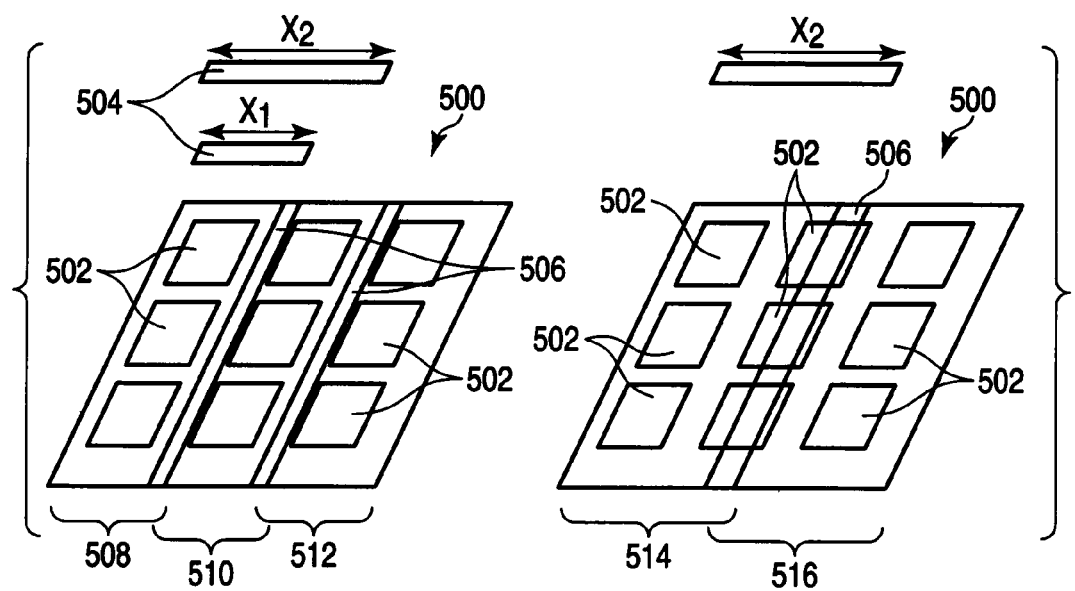
FIG. 4A is a diagram of an array of product regions undergoing laser annealing according to a comparative example.
FIG. 4B is a perspective view showing an array of product regions undergoing laser annealing in accordance with one embodiment of the method.

As in a comparative example shown in FIG. 4A, for example, in the case where an array 500 having 3×3 product regions 502 is laser-annealed and there is the restrictive condition that all overlap regions 506 are to be provided outside the product regions 502, the length of the laser beam 504 is restricted to $x_1$ and the beam 504 will have to be scanned three times over three areas 508, 510 and 512 to cover the entire array.

Where a nitrogen-doped layer is used in accordance with the techniques described above, as shown in FIG. 4B, the annealing may be carried out in a low oxygen atmosphere, thus allowing the grain protrusion of the overlap region 506 to be reduced to an acceptable level. This, in turn, makes it feasible for the overlap region 506 to fall within one or more product regions 502 and for the annealing process to be completed by setting the laser beam to a length $x_2$ greater than $x_1$ and by scanning the beam in fewer scans (two scans over first area 514 and second area 516 in the example of FIG. 4B, as opposed to three scans over areas 508, 510 and 512 in the example of FIG. 4A). In this embodiment, the method allows annealing to be carried out in less time and using fewer laser scans. Therefore, the production time is reduced, leading to an improvement in production efficiency and a reduction in production costs.

An example of the reduction in defects in the form of grain protrusions in the overlap region will now be described with reference to FIGS. 5A, 5B, 6A and 6B. FIG. 5A shows a diagrammatic side view of an excimer laser beam 600 with the energy density of 300 mJ/cm$^2$ scanned over a first area (consisting of regions 1, 2) of a semiconductor layer 604, and a laser beam 602 with the energy density of 300 mJ/cm$^2$ scanned over a second area (consisting of regions 2, 3) of the semiconductor layer 604, according to the comparative example. In the comparative example illustrated, the semiconductor layer 604 is a 50-nm-thick a-Si layer that has been deposited on a glass substrate by introducing silane gas (together with argon (Ar) gas as a carrier) in a CVD chamber containing the glass substrate.

FIG. 5B shows the results from conventionally laser-annealing the semiconductor layer 604, with the x-axis representing the regions shown in FIG. 5A and the y-axis representing grain protrusion height in nanometers. The y-axis includes an upper limit marker (e.g., 20 nm), which represents the maximum grain protrusion height that can be adequately covered by the thin insulating layer (708 in FIG. 7) that will be subsequently formed on the p-Si layer (702 in FIG. 7). As outlined earlier, the presence of grain protrusions that exceed the upper limit typically results in the overlap region exhibiting undesirable electrical and physical characteristics.

From FIG. 5B, it is clear that the overlap region (region 2) in a conventional annealing process exhibits grain protrusion over the upper limit.

Referring now to FIG. 6A, the semiconductor layer 604 has a nitrogen-doped layer 608, in accordance with the present method. In the embodiment illustrated, the semiconductor layer 604 and nitrogen-doped layer 608 are sequentially formed as follows:

1. A glass substrate is supported on a susceptor in a CVD chamber.
2. The air in the CVD chamber is exhausted, and silane gas (together with Ar gas as carrier) is introduced in the CVD chamber containing the glass substrate.
3. A 40-nm-thick a-Si layer is deposited on the glass substrate to form the semiconductor layer 604.
4. $N_2O$ gas is introduced in the CVD chamber together with silane gas to form a 10-nm-thick doped a-Si layer 608 having nitrogen atoms and oxygen atoms at a concentration of $2\times10^{21}$ and $2\times10^{22}$ atoms/cc, respectively.

Thereafter, in the same manner as described above, the first region and second region of the doped a-Si layer 608 are laser-annealed by the laser beams 600 and 602, respectively.

As shown in FIG. 6B, the result of using the nitrogen-doped layer 608 is that the grain protrusion across the overlap region (region 2) is reduced to below the upper limit. For instance, the grain protrusion height in the overlap region is 15 nm, which is lower than the 20-nm upper limit. The value of the grain protrusion height of the annealed semiconductor layer as a whole is therefore less than the upper limit of 20 nm. Furthermore, the grain size of the overlap region is larger than 0.2 μm (e.g., around 0.35 μm), and is substantially uniform. With such acceptable grain size and protrusions, the overlap region no longer exhibits undesirable electrical and physical properties, thus allowing the overlap region to be formed in one or more product regions without adversely affecting the electrical and physical characteristics of the product regions. It should be noted that the use of the nitrogen-doped layer 608 results in the p-Si layer (i.e., after laser annealing) having a surface with a nitrogen concentration of $1\times10^{21}$ atoms/cc, and an oxygen concentration of $1\times10^{22}$ atoms/cc.

Next, a description is given of an array substrate of a liquid crystal display device as an example of the semiconductor device formed from the semiconductor layer annealed using the present method, and a fabrication method thereof. FIG. 7 shows an array substrate 700 for an LCD including a co-planar type TFT as the semiconductor device.

The array substrate 700 includes a transparent insulating substrate 721 such as a glass substrate, and an undercoat layer 722 which is formed on the insulating substrate 721 and functions to prevent impurity diffusion from the insulating substrate 721. A semiconductor layer 724 of p-Si, which is patterned in a predetermined shape, is formed on the undercoat layer 722. The crystalline structure of the semiconductor layer 724 forms a TFT active layer 702 including a source region 702a, a drain region 702b, and a channel region 702c sandwiched between the source and drain regions. A gate insulation film 726, which is made of, e.g., $SiO_2$ or TEOS, is formed on the TFT active layer 702 and undercoat layer 722. The TFT active layer 702 has a first surface and a second surface. When the TFT active layer 702 is deposited on the glass substrate, the second surface is located on the insulating substrate 721 side, and the gate insulation film 726 is provided on the first surface of the TFT active layer 702.

The TFT active layer 702 (and more specifically, the first surface of the layer 702) has a nitrogen concentration of $1\times10^{21}$ atoms/cc. In more general terms, the first surface of the TFT active layer 702 may have a nitrogen concentration in the range of $3\times10^{20}$ to $1\times10^{22}$ atoms/cc, more specifically $5\times10^{20}$ to $5\times10^{21}$ atoms/cc. As described above, the nitrogen concentration is the result of initial doping of the nitrogen-doped layer.

In addition, the TFT active layer 702 (and more specifically the first surface of the layer 702) may have an oxygen concentration of $1\times10^{22}$ atoms/cc. In more general terms, the first surface of the TFT active layer 702 may have an oxygen concentration in the range of $3\times10^{21}$ to $7\times10^{22}$ atoms/cc, more specifically $5\times10^{21}$ to $5\times10^{22}$ atoms/cc. In one form, the first surface of the TFT active layer 702 has a nitrogen concentration of at least $3\times10^{20}$ atoms/cc.

A gate electrode 710 of a metal, such as aluminum (Al), an aluminum (Al) alloy or a MoW alloy, is formed on the gate insulation film 726. The gate electrode 710 is opposed to the channel region 702c of the TFT active layer 702, with the gate insulation film 708 being interposed. An interlayer insulation film 728 of SiNx is formed to cover the gate insulation film 726 and gate electrode 710. Contact holes 90 and 91 are formed in the interlayer insulation film 728 and gate insulation film 726. A source electrode 704 and a drain electrode 706, which are made of a metal such as aluminum or an aluminum alloy, are formed in the contact holes 90 and 91. The source electrode 704 and drain electrode 706 are electrically connected to the source region 702a and drain 702b of the TFT active layer 702, respectively. Of these parts, a thin-film transistor (TFT) 701 is composed.

A protection layer 730 is formed on the interlayer insulation film 728, and a pixel electrode 711, which is made of, e.g., a transparent electrically conductive film, is formed on the protection layer 730. The pixel electrode 711 is electrically connected to the drain electrode 706 of the TFT 701 via a contact hole that is formed in the protection layer 730. Besides, the array substrate 700 includes a signal line, a scanning line, etc., which are not shown.

In one form, the TFT 701 controls the pixel electrode 711 that is disposed on the TFT 701 via an insulating layer in an LCD, and constitutes one of a plurality of TFTs formed in each product region, where each product region makes up an LCD display region or an LCD panel. In another form, the TFT 701 controls pixels in an OLED display device, and constitutes one of a plurality of TFTs formed in each product region, where each product region makes up an OLED display region or an OLED panel.

Next, a description is given of a method of fabricating an array substrate including a TFT with the above-described structure.

Figure 8A:
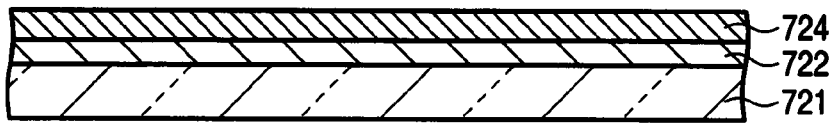
FIGS. 8A, 8B, 8C, and 8D are cross-section diagrams illustrating the method of manufacturing the semiconductor device.

As shown in FIG. 8A, an undercoat film 722 is formed on a transparent substrate 721 such as a glass substrate. As the undercoat film 722, use is made of an $SiO_2$ film which is formed by a CVD method or a sputtering method. Alternatively, as the undercoat film 722, use may be made of a thin film of SiNx or a double-layer thin film of SiNx and $SiO_2$.

Subsequently, a polysilicon (p-Si) film serving as a semiconductor layer 724 is formed on the undercoat film 722. In the case of forming this p-Si film, for example, an a-Si film is formed by a film formation method such as a plasma CVD method or a sputtering method, following which nitrogen doped a-Si film is formed on the a-Si film, or nitrogen is ion-implanted or plasma-doped in an upper portion of the a-Si film. By this fabrication step, the upper portion of the a-Si film is formed of a nitrogen-doped layer. Specifically, in this step, although the nitrogen-doped a-Si layer forms part of the semiconductor layer 724, it can be distinguished from the semiconductor layer by the nitrogen concentration in the nitrogen-doped a-Si layer. The nitrogen concentration and depth (thickness) of the nitrogen-doped a-Si layer is controlled by adjusting the thickness at the forming the nitrogen-doped a-Si layer, the flow rate of the introducing gas, or the energy in the ion implantation or plasma doping process. The nitrogen concentration is, e.g., $3 \times 10^{20}$ atoms/cc.

Figure 8B:
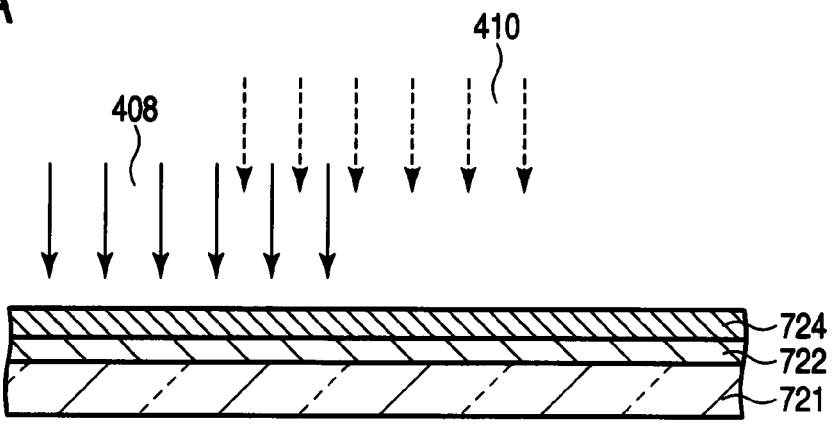

In the following step, as shown in FIG. 8B, the semiconductor layer 724, in which the nitrogen-doped a-Si layer is formed, is laser-annealed to form a p-Si film. At this time, laser annealing 408 is performed on a first region of the semiconductor layer 724 where the nitrogen-doped a-Si layer is formed, and further laser annealing 410 is performed on a second region of the semiconductor layer 724. The first region and second region overlap in the product region, and a p-Si film is formed by the laser annealing step.

Figure 8C:
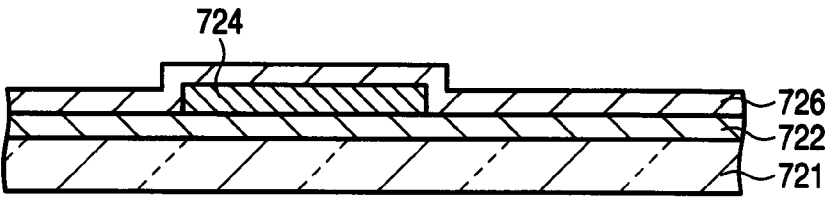

Next, as shown in FIG. 8C, the p-Si film is patterned to form a plurality of island-shaped semiconductor layers 724. Further, a gate insulation film 726, which is made of an $SiO_2$ film, is formed on the undercoat film 722 and the semiconductor layer 724 by, e.g., plasma CVD. As the method of forming the gate insulation film 726, the plasma CVD method may be replaced with some other CVD method, such as an atmospheric pressure CVD method, an LPCVD method, an ECR plasma CVD method or a remote plasma CVD, or a sputtering method. As the material gas, use may be made of $TEOS.O_2$ gas or $SiH_4.O_2$ gas.

Following the formation of the gate insulation film 726, the gate insulation film may be annealed, for example, under such conditions that the annealing is performed in a nitrogen atmosphere at 600° C. for five hours.

Figure 8D:
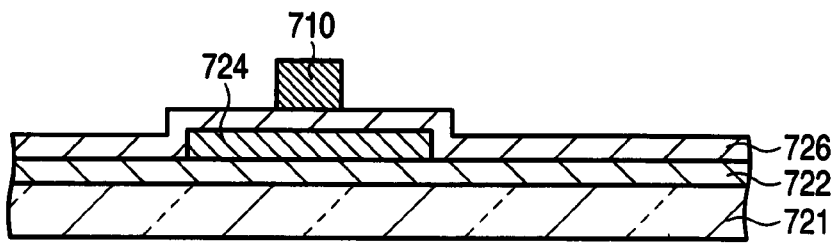

Subsequently, as shown in FIG. 8D, for instance, a low-resistance metal film of a molybdenum-tungsten alloy (MoW) or aluminum (Al) or an impurity-doped polycrystalline silicon film is formed on the gate insulation film 726, and this film is patterned in a predetermined shape, thereby forming a gate electrode 710.

Figure 9A:
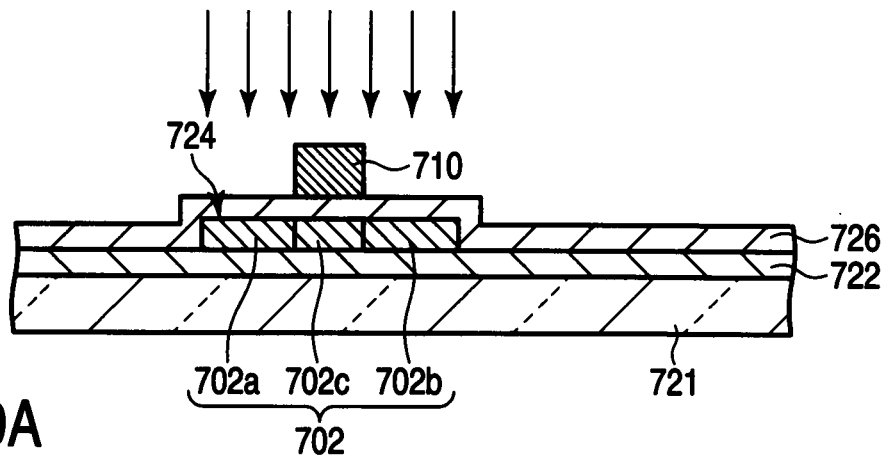
FIGS. 9A, 9B, and 9C are cross-section diagrams illustrating the method of manufacturing the semiconductor device.

After the gate electrode 710 having a predetermined shape is formed, phosphorus (P), which is n-type impurity, is ion-implanted in the semiconductor layer 724, as shown in FIG. 9A, in a self-alignment fashion by using the gate electrode 710 as a mask. Thereby, a source region 702a and a drain region 702b are formed in the p-Si film. Then, the ion-implanted phosphorus is activated by annealing such as laser annealing or thermal annealing. Thus, a TFT active layer 702 including the source region 702a, drain region 702b, and channel region 702c sandwiched therebetween is formed.

In the case of fabricating a P-channel TFT, P-type impurities, such as boron, are ion-implanted in the semiconductor layer 724.

Figure 9B:
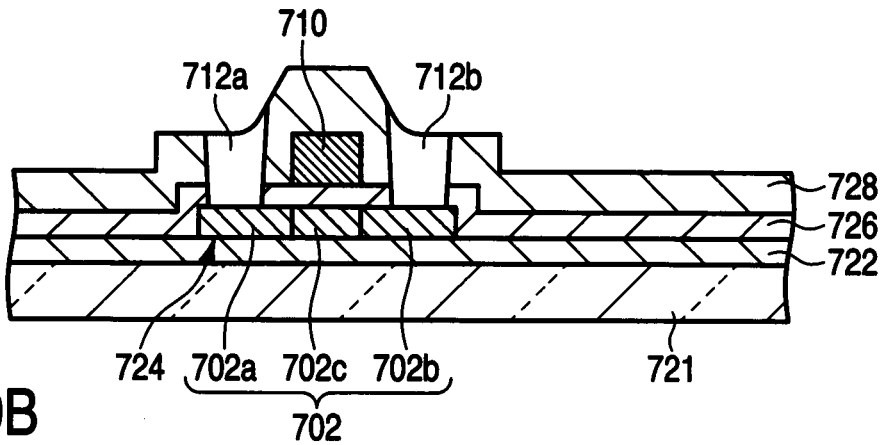

Then, as shown in FIG. 9B, an interlayer insulation film 728 with insulating properties is formed on the entire surfaces of the gate insulation film 726 and gate electrode 710. Contact holes 712a and 712b, which communicate with the source region 702a and drain region 702b of the TFT active layer 702, are formed in the interlayer insulation film 728.

Figure 9C:
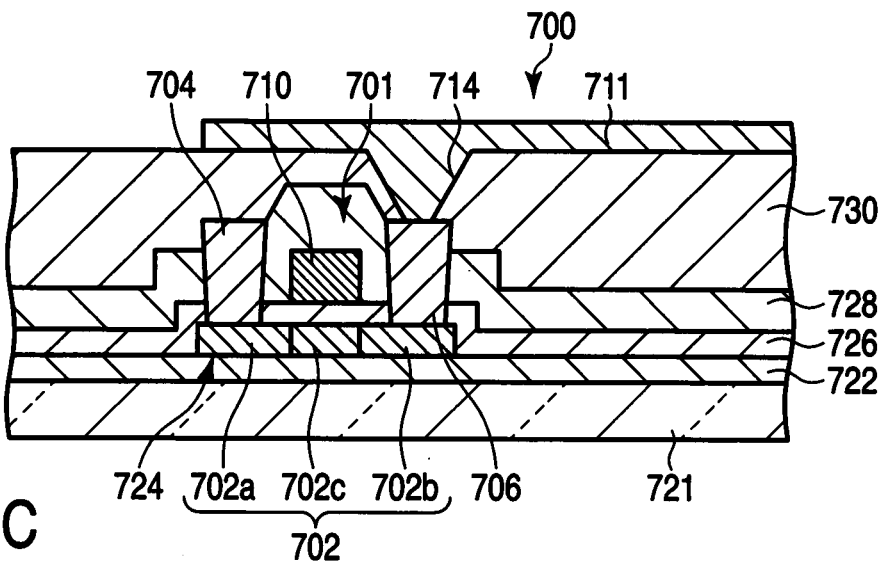

As shown in FIG. 9C, a metal film of, e.g., Al, is formed over the entire surface of the interlayer insulation film 728 so as to fill the contact holes 712a and 712b. Then, this metal film is patterned to form a source electrode 704 and a drain electrode 706. Thereby, the TFT 701 is obtained.

Following the above, in order to protect the TFT 701 from, e.g., adsorption of moisture, a protection film of, e.g., a silicon nitride film is formed. Further, a contact hole 714, which communicates with the drain electrode 706, is formed in the protection film 730. A transparent electrically conductive film of, e.g., ITO is formed over the entire surface of the protection film 730 so as to fill the contact hole 714, and this transparent electrically conductive film is patterned to form a pixel electrode 711. Thereby, an array substrate 700 including a plurality of TFTs 701 is obtained.

The present invention is not limited directly to the embodiment described above, and its components may be embodied and modified without departing from the spirit of the invention. Further, various inventions may be made by suitably combining a plurality of components described in connection with the foregoing embodiment. For example, some of the components according to the foregoing embodiment may be omitted. Furthermore, components according to different embodiments may be combined as required.

For example, in the above-described laser annealing method, the steps are carried out in a predetermined order. This method, however, may be modified such that the steps are carried out in an order different from the order as described above. Besides, this method may be modified so as to perform additional steps. The feature that the overlap region is present in one or more product regions is not limited to the embodiment in which the overlap region is formed in the plural product regions. It should suffice if at least a part of the overlap region is formed in the product region.

Furthermore, the nitrogen-doped layer has been described as being effective in reducing grain protrusions, but the nitrogen-doped layer is not limited to this use. For example, the nitrogen-doped layer may be used in order to reduce defects such as ablation. The above-described modifications fall within the scope of the present invention.

What is claimed is:

1. A semiconductor device comprising:
 a laser-annealed semiconductor layer comprising a first polycrystalline silicon layer, and a second polycrystalline silicon layer integrally formed on the first polycrystalline silicon layer and doped with nitrogen,
 the laser-annealed semiconductor layer comprising a first area laser-annealed and a second area laser-annealed wherein a part of the first area overlaps with a part of the second area in a direction perpendicular to a surface of the laser-annealed semiconductor layer and the overlap region is laser-annealed by two times, the laser-annealed semiconductor layer having a nitrogen concentration of at least $3\times10^{20}$ atoms/cc on the second polycrystalline silicon layer and a root mean square (rms) value of grain protrusion height is less than 20nm.

2. The semiconductor device of claim 1, wherein the nitrogen concentration is in the range of $5\times10^{20}$ to $3\times10^{22}$ atoms/cc.

3. The semiconductor device of claim 2, wherein the nitrogen concentration is in the range of $5\times10^{20}$ to $5\times10^{21}$ atoms/cc.

4. The semiconductor device of claim 1, wherein the semiconductor layer has an oxygen concentration in the range of $3\times10^{21}$ to $7\times10^{22}$ atoms/cc at the surface thereof.

5. The semiconductor device of claim 4, wherein the oxygen concentration is in the range of $5\times10^{21}$ to $5\times10^{22}$ atoms/cc.

6. The semiconductor device of claim 1, wherein the semiconductor device is one of a plurality of semiconductor devices formed in a display region of a display device.

7. A semiconductor device comprising:
a laser-annealed semiconductor layer comprising a first polycrystalline silicon layer, and a second polycrystalline silicon layer integrally formed on the first polycrystalline silicon layer and doped with nitrogen, the laser-annealed semiconductor layer comprising a first area laser-annealed and a second area laser-annealed wherein a part of the first area overlaps with a part of the second area in a direction perpendicular to a surface of the laser-annealed semiconductor layer and the overlap region is laser-annealed by two times, the laser-annealed semiconductor layer having a first surface formed of the second polycrystalline silicon layer and second surface formed of the first polycrystalline silicon layer, and being disposed on a substrate such that the second surface is adjacent to the substrate;
a gate electrode disposed over the laser-annealed semiconductor layer and adjacent to the first surface;
a gate insulating layer separating the gate electrode and the first surface; and
source and drain electrodes connected to the laser-annealed semiconductor layer;
wherein a nitrogen concentration at the first surface of the laser-annealed semiconductor layer is at least $3\times10^{20}$ atoms/cc and a root mean square (rms) value of grain protrusion height is less than 20nm.

8. A semiconductor device comprising:
a laser-annealed semiconductor layer comprising a first polycrystalline silicon layer, and a second polycrystalline silicon layer integrally formed on the first polycrystalline silicon layer and doped with nitrogen,
the laser-annealed semiconductor layer comprising a first area laser-annealed and a second area laser-annealed wherein a part of the first area overlaps with a part of the second area in a direction perpendicular to a surface of the laser-annealed semiconductor layer and the overlap region is laser-annealed by two times,
wherein a grain protrusion across the overlap region is higher than a grain protrusion in regions other than the overlap region, and the laser-annealed semiconductor layer has a nitrogen concentration of at least $3\times10^{20}$ atoms/cc on the second polycrystalline silicon layer and a root mean square (rms) value of grain protrusion height is less than 20nm.

9. The semiconductor device of claim 8, wherein the nitrogen concentration is in the range of $5\times10^{20}$ to $3\times10^{22}$ atoms/cc.

10. The semiconductor device of claim 9, wherein the nitrogen concentration is in the range of $5\times10^{20}$ to $5\times10^{21}$ atoms/cc.

11. The semiconductor device of claim 8, wherein the semiconductor layer has an oxygen concentration in the range of $3\times10^{21}$ to $7\times10^{22}$ atoms/cc at the surface thereof.

12. The semiconductor device of claim 11, wherein the oxygen concentration is in the range of $5\times10^{21}$ to $5\times10^{22}$ atoms/cc.

13. The semiconductor device of claim 8, wherein the semiconductor device is one of a plurality of semiconductor devices formed in a display region of a display device.

* * * * *